US010187969B2

(12) United States Patent
Ooi et al.

(10) Patent No.: US 10,187,969 B2
(45) Date of Patent: Jan. 22, 2019

(54) CIRCUIT STRUCTURE, ELECTRICAL JUNCTION BOX, AND SPACER

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Tomohiro Ooi, Mie (JP); Yoshikazu Sasaki, Mie (JP); Takehito Kobayashi, Mie (JP); Yukinori Kita, Mie (JP); Shigeki Yamane, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/508,668

(22) PCT Filed: Aug. 25, 2015

(86) PCT No.: PCT/JP2015/073776
§ 371 (c)(1),
(2) Date: Mar. 3, 2017

(87) PCT Pub. No.: WO2016/035600
PCT Pub. Date: Mar. 10, 2016

(65) Prior Publication Data
US 2017/0290139 A1    Oct. 5, 2017

(30) Foreign Application Priority Data

Sep. 5, 2014 (JP) .................................. 2014-180914

(51) Int. Cl.
*H05K 7/20* (2006.01)
*H05K 1/02* (2006.01)
*H05K 1/18* (2006.01)

(52) U.S. Cl.
CPC ............. *H05K 1/0203* (2013.01); *H05K 1/18* (2013.01); *H05K 7/209* (2013.01); *H05K 7/20845* (2013.01)

(58) Field of Classification Search
CPC ........ H05K 1/0203; H05K 1/02; H05K 7/209; H05K 1/111; H05K 1/116; H05K 5/0008;
(Continued)

(56) References Cited

U.S. PATENT DOCUMENTS 5,003,429 A * 3/1991 Baker ................ H05K 7/20509
165/185
2003/0052557 A1* 3/2003 Toda ........................ C23C 4/00
310/67 R
(Continued)

FOREIGN PATENT DOCUMENTS

JP    2003-031977    1/2003
JP    2005-151617    6/2005
(Continued)

OTHER PUBLICATIONS

Search Report issued in International Bureau of WIPO Patent Application No. PCT/JP2015/073776, dated Nov. 24, 2015.

*Primary Examiner* — Mandeep S Buttar
(74) *Attorney, Agent, or Firm* — Greenblum & Bernstein, P.L.C.

(57) ABSTRACT

A circuit structure includes a circuit board mounted with electronic components, a heat release member overlaid by the circuit board and releasing heat of the circuit board, a screw screwing the circuit board to the heat release member, and a spacer on which an insertion hole is formed to insert a shaft portion of the screw and the spacer is arranged
(Continued)

between the circuit board and the screw to receive the screw. The spacer includes a board presser pressing the circuit board and a heat release member presser pressing the heat release member when the circuit board is screwed to the heat release member.

10 Claims, 10 Drawing Sheets

(58) Field of Classification Search
CPC .. H05K 5/0013; H05K 7/2049; H05K 9/0015; F16B 5/0241; F16B 29/00; F16B 2/14; F16B 31/027; F16B 35/00; F16B 37/00; F16B 37/064; F16B 39/108; F16B 39/26; F16B 39/36; F16B 43/00; F16B 5/0258; H01L 23/36; H01L 23/40; H01L 23/4006
USPC .......................... 361/720, 742, 758, 804, 770
See application file for complete search history.

(56) References Cited

U.S. PATENT DOCUMENTS

| | | | |
|---|---|---|---|
| 2005/0099778 A1* | 5/2005 | Nakanishi | H05K 3/0061 361/704 |
| 2010/0246139 A1 | 9/2010 | Suzuki et al. | |
| 2011/0085305 A1* | 4/2011 | Ochi | B21D 53/20 361/748 |
| 2011/0316035 A1* | 12/2011 | Shin | H05K 1/05 257/99 |
| 2013/0091693 A1* | 4/2013 | Campbell | H05K 7/20 29/592.1 |
| 2014/0262449 A1* | 9/2014 | Gektin | H01L 23/4006 174/252 |

FOREIGN PATENT DOCUMENTS

| | | |
|---|---|---|
| JP | 2007-305649 | 11/2007 |
| JP | 2010-232318 | 10/2010 |
| JP | 2012-009801 | 1/2012 |

* cited by examiner

CIRCUIT STRUCTURE, ELECTRICAL JUNCTION BOX, AND SPACER

FIELD OF THE INVENTION

The present invention relates to a circuit structure, an electrical junction box, and a spacer.

BACKGROUND OF THE INVENTION

Conventionally, in a known example of a circuit structure, a circuit board is overlaid on a heat release member releasing heat of the circuit board to an exterior. In a circuit structure of this type, a circuit board is bonded on top of a heat release member using an adhesive. In a circuit structure in Patent Literature 1, when a sheet body, in which insulation fibers are woven into a sheet, is overlaid on the adhesive applied to a top of the heat release member, the adhesive passes through the entire sheet body almost evenly. By adding the circuit over the sheet body and pressing the circuit toward the heat release member, the circuit is fixated to the top of the heat release member.

RELATED ART

Patent Literature

Patent Literature 1: Japanese Patent Laid-open Publication No. 2005-151617.

SUMMARY OF THE INVENTION

Problems to Be Solved by the Invention

In Patent Literature 1, when a circuit is fixated to a top of a heat release board, the circuit is pressed toward the heat release board, however, it is not easy to press with a uniform force throughout an entire surface of the circuit. In general, in order to press the entire surface of the circuit with uniform force, use of a jig is required, but manufacturing cost may increase by equipping the jig.

The present invention was achieved in view of the above-noted circumstance and reduces manufacturing cost and fixates positions of the circuit board and the heat release member.

Means for Solving the Problems

A circuit structure of the present invention includes a circuit board mounted with electronic components, a heat release member overlaid by the circuit board and releasing heat of the circuit board, a screw screwing the circuit board to the heat release member, and a spacer on which an insertion hole is formed to insert a shaft portion of the screw, and the spacer is arranged between the circuit board and the screw to receive the screw. When the circuit board is screwed to the heat release member using the screw, the spacer provides a board presser pressing the circuit board and a heat release member presser pressing the heat release member. The insertion hole where the shaft portion of the screw is inserted is formed on the spacer according to the present invention. The spacer is arranged between the circuit board and the screw to receive the screw. The spacer provides the board presser pressing the circuit board and the heat release member presser pressing the heat release member when the circuit board is screwed to the heat release member releasing heat of the circuit board using the screw.

This configuration allows positions of the circuit board and the heat release member to be fixated by pressing the circuit board toward the heat release member via the spacer using the force applied when screwed, and therefore a jig is not required and manufacturing cost can be reduced. Further, by pressing the circuit board with the board presser of the spacer, compared to a case where the screw directly presses the circuit board, deformation of the circuit board can be suppressed. Furthermore, by pressing the heat release member with the heat release member presser of the spacer, the heat release member receives, via the spacer, a strong force applied when screwed, and the strong force does not affect the circuit board, and therefore the deformation of the circuit board from the force applied when screwed can be suppressed.

The following aspect is preferred as an embodiment of the present invention. The spacer has insulating characteristics and an insulating adhesive layer is overlaid on a surface on the circuit board side of the heat release member, and the heat release member presser presses the heat release member from above the adhesive layer. In this way, a space between the circuit board and the heat release member can be insulated through the spacer and the adhesive layer.

The heat release member presser presses an edge of the adhesive layer. In this way, while inhibiting the adhesive from being transmitted toward the screw, the space between the circuit board and the heat release member can be insulated.

The heat release member presser is in close contact with the heat release member. In this way, the adhesive can be inhibited from being transmitted toward the screw.

The heat release member presser is arranged annularly around the shaft portion of the screw.

A depression is formed in the heat release member, the depression sinking lower than a surface of the heat release member where the heat release member presser presses. A receiver receiving the screw is formed around the insertion hole of the spacer and the receiver enters inside the depression.

An electrical junction box includes the circuit structure.

Effect of the Invention

The present invention allows reducing manufacturing cost and fixating positions of the circuit board and the heat release member.

MODE FOR CARRYING OUT THE INVENTION

Embodiment 1

Hereafter, an embodiment 1 of the present invention is described with reference to FIGS. 1 to 7. An electrical junction box 10 is arranged in an electricity supply path between an electricity source (such as a vehicle battery of electric vehicles, hybrid vehicles, and the like) and a load from an in-vehicle electric component such as a lamp and a drive motor, for example. The electrical junction box 10 can for example be used with a DC-DC converter, an inverter, and the like. In the descriptions below, an up-down direction is defined based on a direction in FIG. 3.

(Electrical Junction Box 10)

Figure 1:
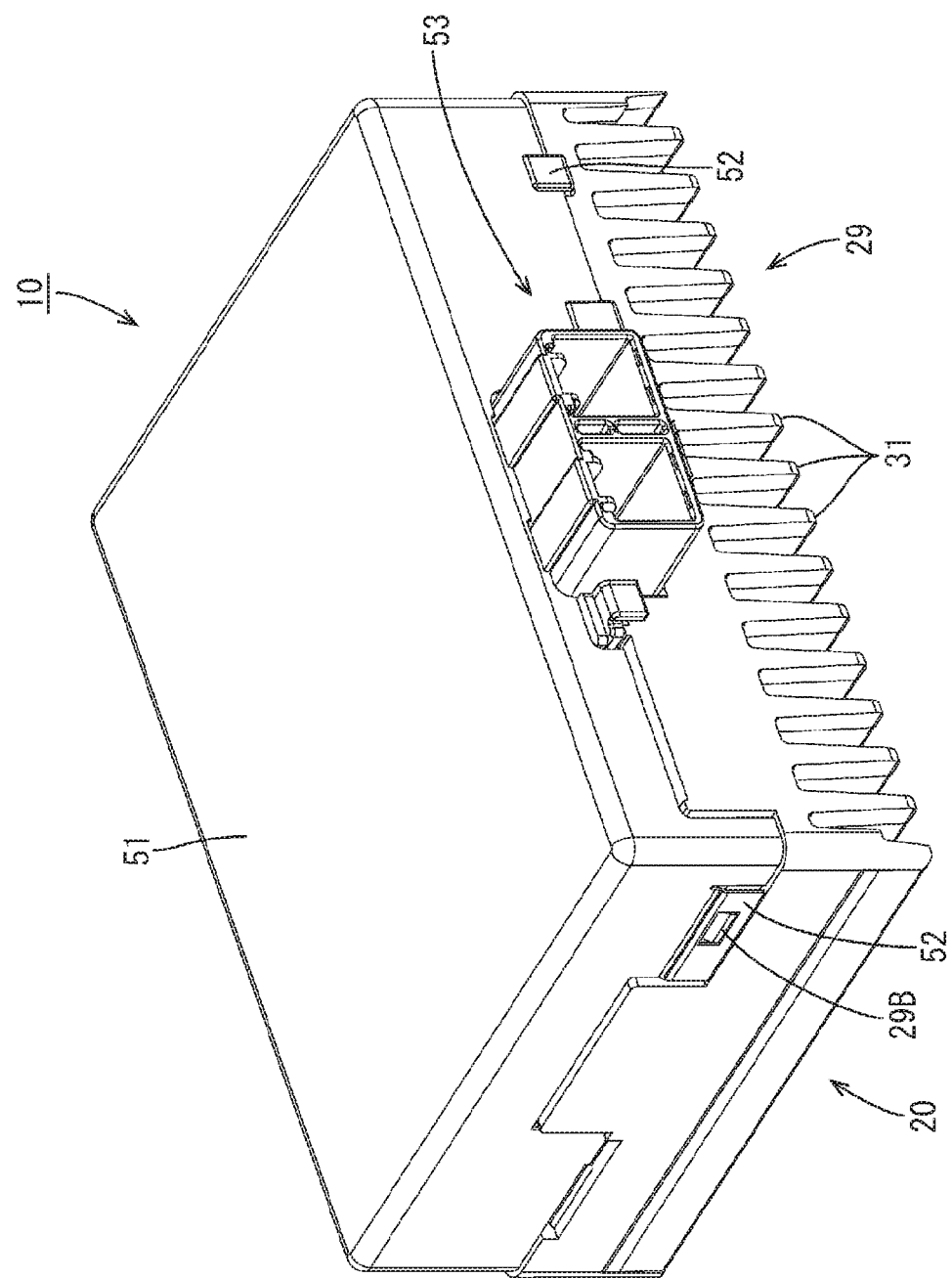
FIG. 1 is a perspective view of an electrical junction box according to an embodiment 1.

As shown in FIG. 1, the electrical junction box 10 includes a circuit structure 20, a cover 51 covering a top surface of the circuit structure 20, and a connector housing 53.

The cover 51 is formed by bending a plate-like metal such as aluminum and has a box shape having a downward opening. The cover 51 includes an engaged portion 52 on a lower edge, the engaged portion 52 holding the cover 51 in a closed state by locking with a locking portion 29B formed on a side surface of a heat release member 29. The connector housing 53 is in a tubular shape where a mating connector housing can be fitted and a connector terminal 26 projects on an interior thereof.

(Circuit Structure 20)

Figure 2:
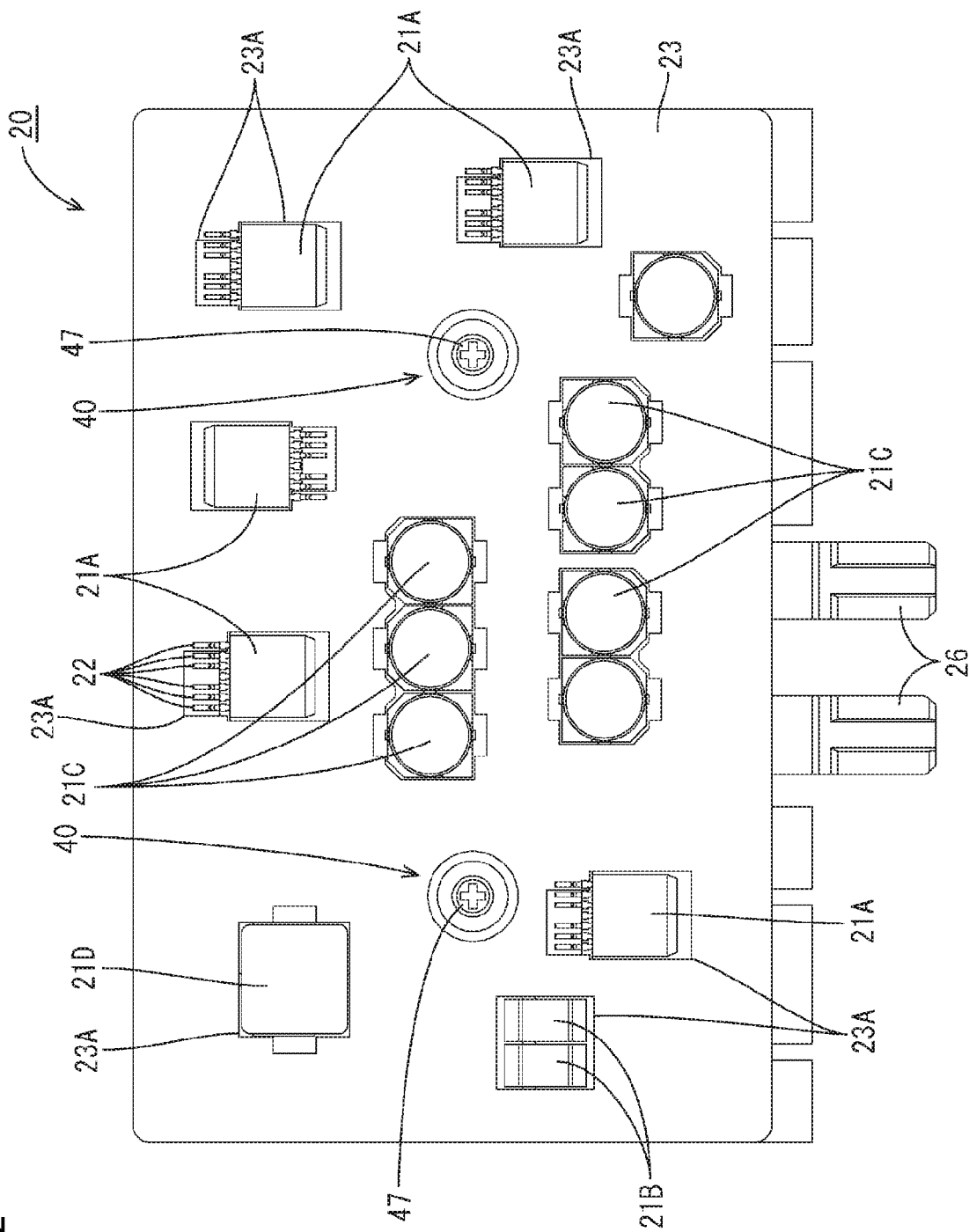
FIG. 2 is a plan view illustrating a circuit structure.
Figure 3:
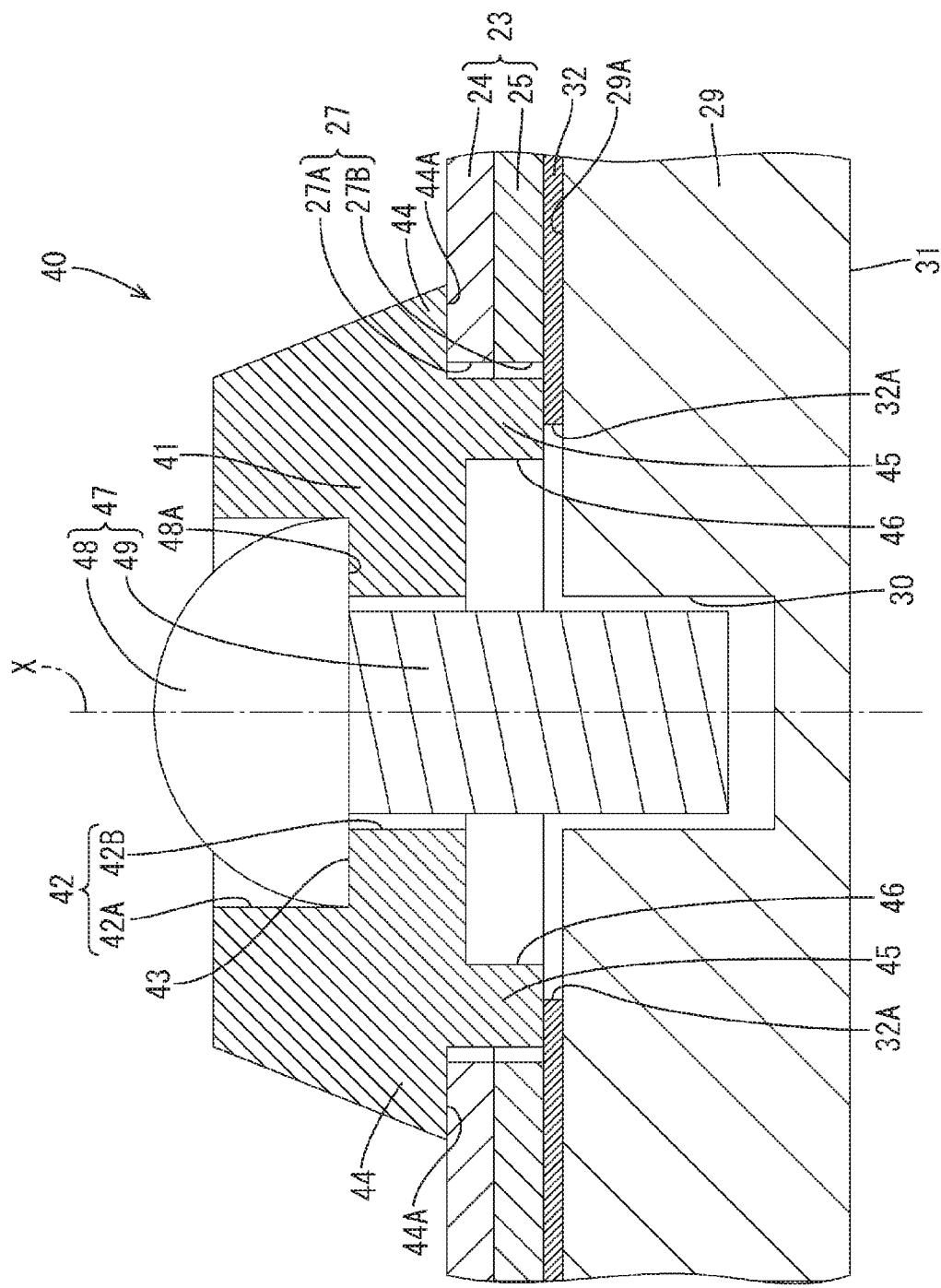
FIG. 3 is a cross-sectional, expanded view of a portion of the circuit structure screwed down using a screw.
Figure 4:
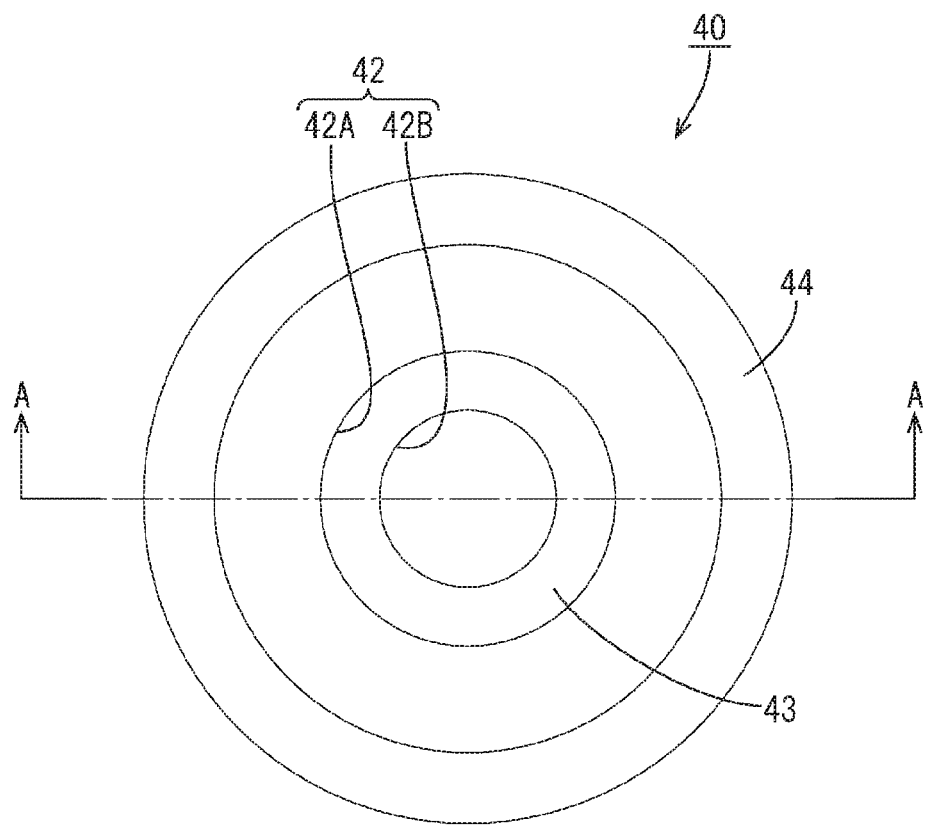
FIG. 4 is a plan view of a spacer.
Figure 5:
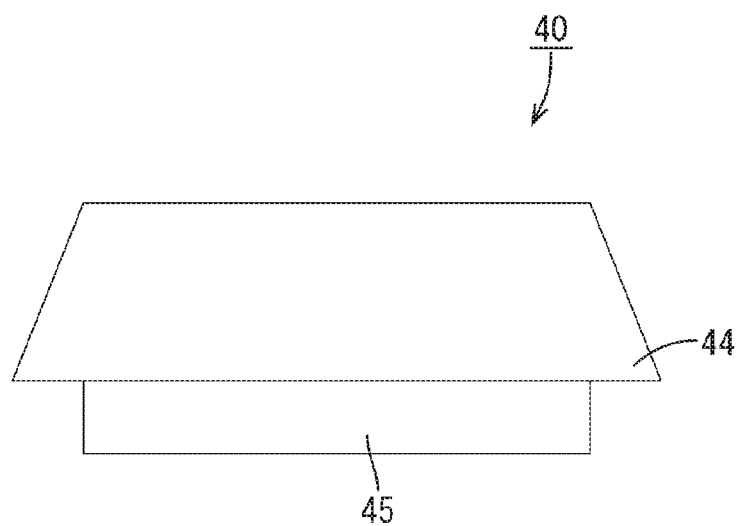
FIG. 5 is a side view of the spacer.
Figure 6:
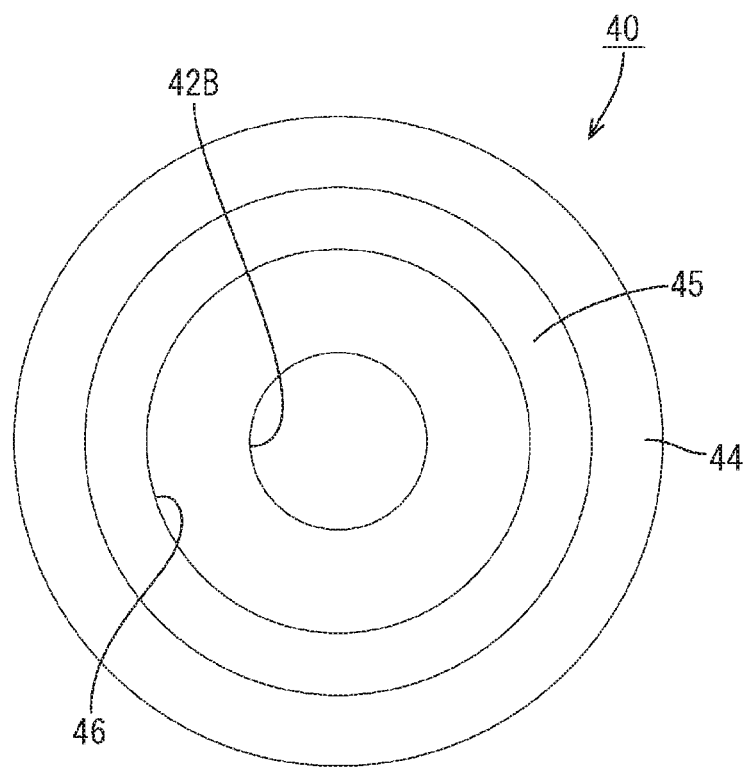
FIG. 6 is a bottom view of the spacer.
Figure 7:
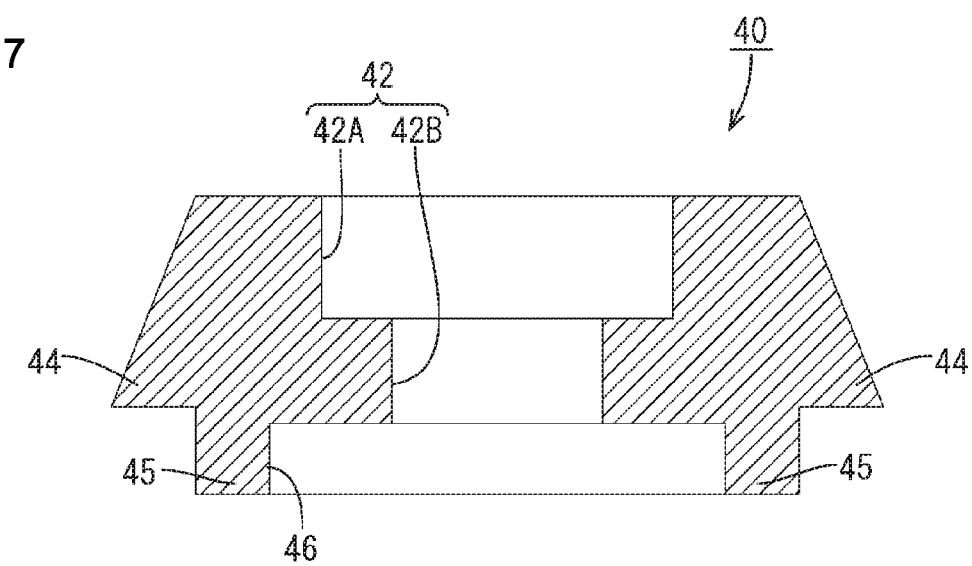
FIG. 7 is a cross-sectional view taken along line A-A of FIG. 4.
Figure 8:
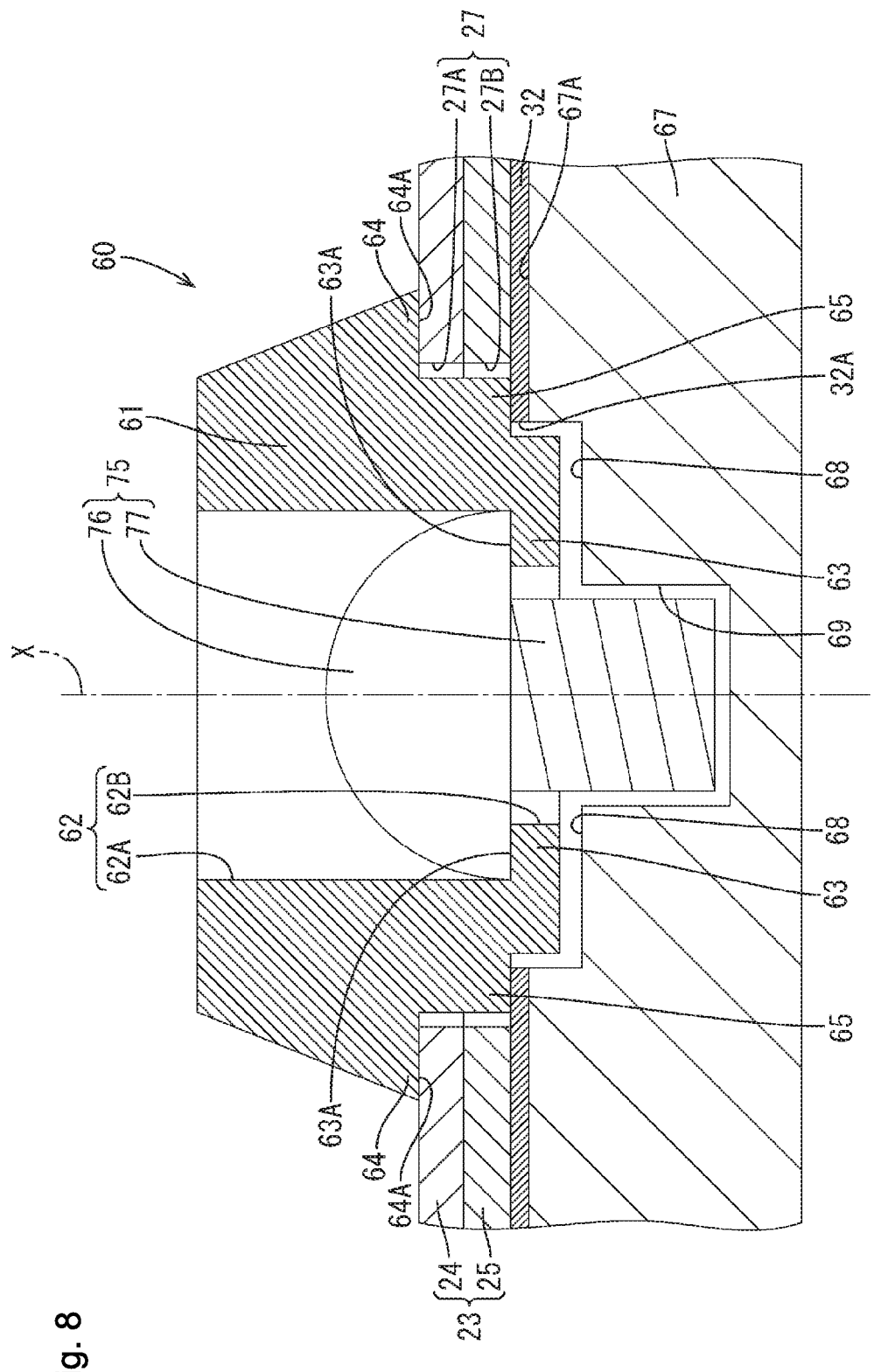
FIG. 8 is a cross-sectional, expanded view of a portion of a circuit structure screwed down using a screw according to an embodiment 2.
Figure 9:
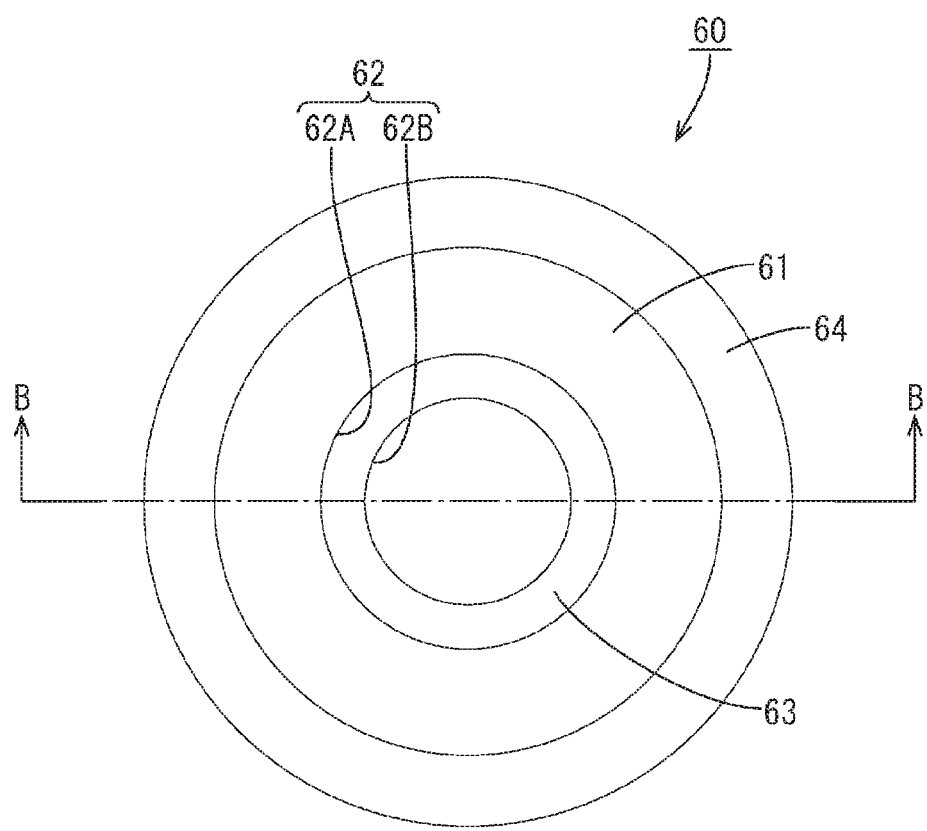
FIG. 9 is a plan view of a spacer.
Figure 10:
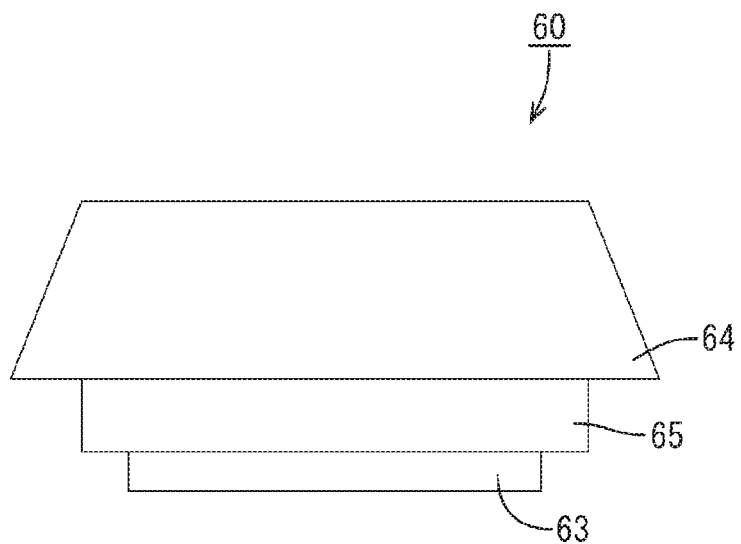
FIG. 10 is a side view of the spacer.
Figure 11:
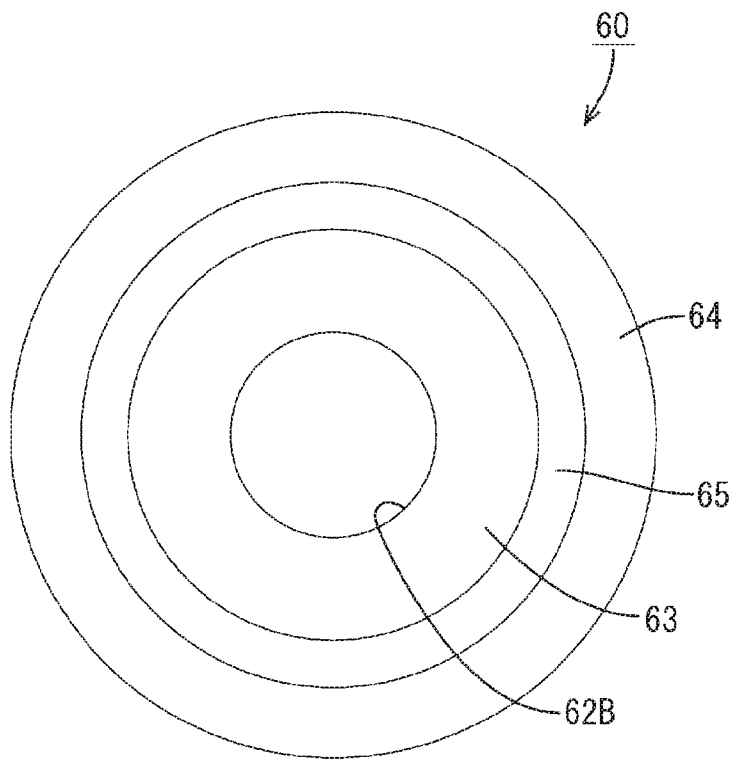
FIG. 11 is a side view of the spacer.
Figure 12:
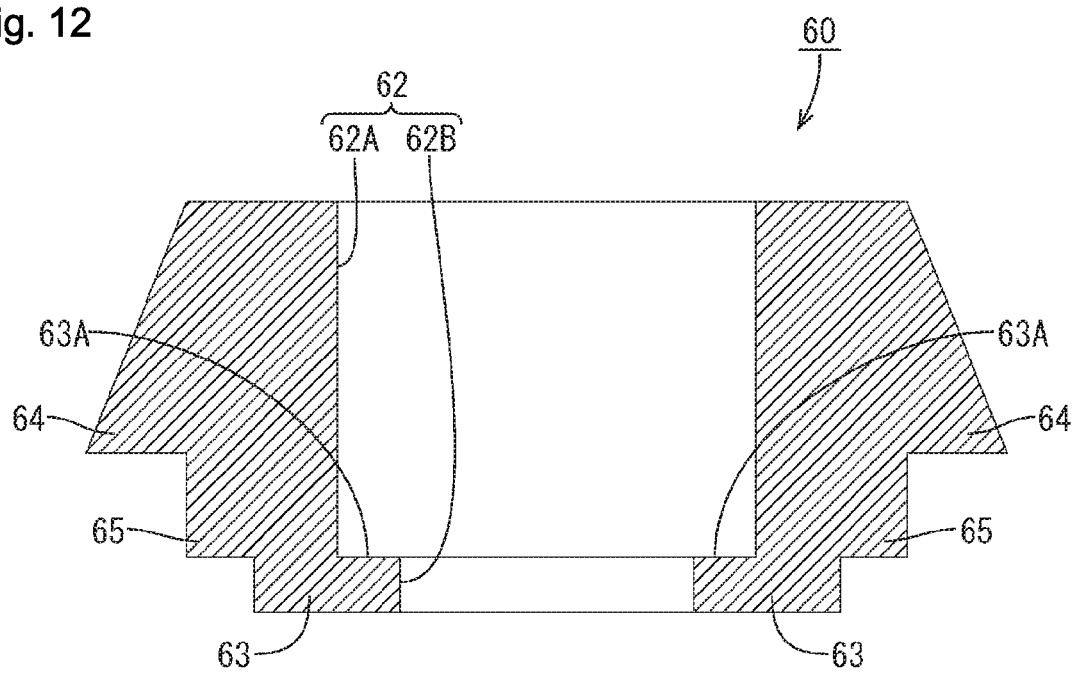
FIG. 12 is a cross-sectional view taken along line B-B of FIG. 9.

As shown in FIGS. 2 and 3, the circuit structure 20 includes a circuit board 23 mounted with electronic components 21A to 21D, the heat release member 29 overlaid by the circuit board 23 and releasing heat of the circuit board 23, an adhesive layer 32 bonding a space between the circuit board 23 and the heat release member 29, screws 47 fixating the circuit board 23 to the heat release member 29, and spacers 40 arranged between the circuit board 23 and the screws 47.

The electronic components 21A to 21D are configured with switching elements 21A, resistors 21B, capacitors 21C, and a coil 21D, for example. The switching element 21A is configured with a relay such as a FET, a mechanical relay, and the like, and includes a lead terminal (not shown in the drawings) on a bottom face of the box-shaped main body. In addition, a plurality of lead terminals 22 project laterally from a side of the switching element 21A.

(Circuit Board 23)

The circuit board 23 is a rectangular shape and is configured by bonding an insulating board 24 with a bus bar 25 using an adhesive member (for example, adhesive sheet, adhesive agent, and the like). The insulating board 24 is configured with a conductive path (not shown in the drawings) formed with copper foil and the like print-wired to an insulation plate formed with insulation material. The lead terminals 22 are soldered to the conductive path of the insulating board 24. Component insertion holes 23A are formed running through the insulating board 24 such that the electronic components 21A to 21D can be inserted through to the bus bar 25 side of the insulating board 24. The bottom of the switching element 21A and the lead terminals 22 on the side surface of the switching element 21A are soldered to the bus bar 25 through the component insertion holes 23A. The bus bar 25 is formed into a shape of the conductive path by punching out a metallic plate made of copper, copper alloy, or the like. An edge of the bus bar 25 is integral with the connector terminal 26.

In the circuit board 23, a left/right pair of through holes 27 are formed through which the spacer 40 (described later) is inserted. The through holes 27 have a circular shape and are arranged at positions separated from a circumferential edge of the circuit board with separation of a predetermined distance from each other. In addition, the through hole 27 is arranged in a vicinity of the electronic components 21A, 21B, and 21D having a large heat generation. The through hole 27 is formed by overlapping through holes 27A and 27B formed in the insulating board 24 and bus bar 25 respectively.

(Heat Release Member 29)

The heat release member 29 is configured with a metallic material having excellent thermal conductivity such as aluminum alloy, copper alloy, and the like. The heat release member 29 is almost identical in size with the circuit board 23 and has a screw hole 30 formed in a U shape where a female threading is provided to screw with the screw 47 on a flat top surface 29A. A large number of radiation fins 31 are arranged side by side on the bottom face of the heat release member 29.

The adhesive layer 32 uses a liquid adhesive. Various types of the adhesive can be used, of which a heat curable type and thermoplastic type are examples. The adhesive layer 32 is not layered on the top surface of the heat release member 29 in a range with a predetermined radius from the center of the screw hole 30, and therefore, the adhesive layer 32 includes a circular shaped edge 32A surrounding a shaft portion 49 of the screw 47.

(Spacer 40)

As shown in FIGS. 3 to 7, the spacer 40 is composed of an insulating composite resin and includes a tubular insertion portion 41 where the screw 47 is inserted, a board presser 44 pressing the circuit board 23 when the circuit board 23 is screwed to the heat release member 29, and a heat release member presser 45 pressing the heat release member 29 when the circuit board 23 is screwed to the heat release member 29.

The insertion portion 41 is formed with an insertion hole 42 where the screw 47 is inserted and includes a receiver 43 receiving a head 48 of the screw 47. The insertion hole 42 includes a head insertion hole 42A where the head 48 of the screw 47 is inserted and a shaft portion insertion hole 42B where the shaft portion 49 is inserted.

The head insertion hole 42A is formed in the circular shape having substantially the same diameter as the head 48 and most of the head 48 is fitted in the head insertion hole 42A, except for a top portion of the head 48. The shaft insertion hole 42B has a diameter reduced in a step shape from the head insertion hole 42A and is formed having a slight gap between an outer circumference of the shaft portion 49 and the shaft insertion hole 42B. An expanded diameter hole 46 having a diameter expanded in a step shape is provided below the shaft insertion hole 42B.

The board presser 44 is a portion where the insertion portion 41 flares in a radial direction and the outer circumference of the board presser 44 is in a tapered shape having the diameter on the lower side increasing in a sloping shape. The board presser 44 is formed in a true circle annular shape centered on a center axis X of the spacer 40. A bottom face 44A of the board presser 44 is overlaid on the circuit board 23 in the vicinity of the insertion hole 42 along a hole edge of the insertion hole 42 of the circuit board 23.

The heat release member presser 45 is provided projecting in a truly circular annular shape on the bottom face of the insertion portion 41 and presses an entire circumference of the edge 32A of the adhesive layer 32 from above. In the present embodiment, an approximately middle portion of the heat release member presser 45 in the radial direction (left/right direction in FIG. 3) presses back the edge 32A. By pressing the edge 32A of the adhesive layer 32 with the heat release member presser 45, a creepage distance is secured between a heat release board (heat release member 29) and the circuit structure (circuit board 23). A projection dimension of the heat release member presser 45 from the bottom face of the board presser 44 (up-down direction in FIG. 3) is the same as a thickness dimension of the circuit board 23 (up-down direction in FIG. 3). A gap is formed between the outer circumference of the heat release member presser 45 and a wall of the insertion hole 42 of the circuit board 23. The spacer 40 is formed by extrusion molding and the like, for example, and has strength capable of withstanding the force applied when screwed. The screw 47 is metallic and includes the head 48 and the cylindrical shaft portion 49 having a male thread.

A manufacturing method of the circuit structure 20 is described. The circuit board 23 is formed by bonding the insulating board 24 and the bus bar 25 using the adhesive member, and the electronic components 21A to 21D and the like are mounted to the circuit board 23 by reflow soldering.

Next, the adhesive layer 32 is formed by applying the adhesive at a predetermined position on the top surface of the heat release member 29, and the circuit board 23 is overlaid on the adhesive layer 32. When the spacer 40 is attached by inserting the heat release member presser 45 of the spacer 40 through the through hole 27 of the circuit board 23, the board presser 44 of the spacer 40 makes contact with the top surface of the circuit board 23 and the bottom face of the heat release member presser 45 is arranged on top of the edge 32A of the adhesive layer 32.

The shaft portion 49 of the screw 47 is threadably mounted to the screw hole 30 of the heat release member 29 through the insertion hole 42 of the spacer 40. When a bottom face 48A of the head 48 contacts the receiver 43 and the screw 47 is threaded further, the bottom face 44A of the board presser 44 presses down (the vicinity of) the entire circumference of the hole edge of the through hole 27 of the circuit board 23, and the bottom face of the heat release member presser 45 presses down the edge 32A of the adhesive layer 32.

The present embodiment achieves the following advantageous effects. This embodiment allows positions of the circuit board 23 and the heat release member 29 to be fixated by pressing the circuit board 23 toward the heat release member 29 side via the spacer 40 using the force applied when screwed, and therefore relative positions of the circuit board 23 and the heat release member 29 can be positioned and fixated without using a jig and manufacturing cost can be reduced. Further, by pressing the circuit board 23 with the board presser 44 of the spacer 40, compared to a case where the circuit board 23 is directly pressed by the screw 47, deformation of the circuit board 23 can be suppressed. Furthermore, by pressing the heat release member 29 with the heat release member presser 45 of the spacer 40, strong force applied when screwed is received by the heat release member 29 via the spacer 40 and the force imparted to the circuit board 23 is weakened, and therefore the deformation of the circuit board 23 from the force applied when screwed can be suppressed.

In addition, the spacer 40 has insulating characteristics and the adhesive layer 32 having insulating characteristics is overlaid on a surface on the circuit board 23 side of the heat release member 29, and the heat release member presser 45 presses the heat release member 29 from above the adhesive layer 32. In this way, the space between the circuit board 23 and the heat release member 29 can be insulated through the spacer 40 and the adhesive layer 32, and therefore, a short circuit can be prevented from the circuit board 23 to the heat release member 29 via the screw 47.

Moreover, the heat release member presser 45 presses the edge 32A of the adhesive layer 32. In this way, while inhibiting the adhesive of the adhesive layer 32 from being transmitted toward the screw 47, the space between the circuit board 23 and the heat release member 29 can be insulated.

In addition, the heat release member presser 45 is arranged annularly around the shaft portion 49 of the screw 47 and allows the entire circumference of the edge 32A of the adhesive layer 32 to be pressed. Therefore, the space between the conductive path of the circuit board 23 and the heat release member 29 can be insulated reliably and the heat release member presser 45 can inhibit the adhesive from flowing toward the screw hole 30. Furthermore, because the positions near the electronic components 21A to 21D having the large heat generation are screwed down via the spacer 40 on an inner side of the circuit board 23 rather than around a circumference of the circuit board 23, curving of the circuit board 23 around a heat source can be suppressed.

Embodiment 2

Hereafter, an embodiment 2 of the present invention is described with reference to FIGS. 8 to 12. In the embodiment 2, the shape of a spacer 60 is different from the embodiment 1 and thus, the shapes of a screw 75 and a heat release member 67 are different. Otherwise, the embodiment 2 is the same as the embodiment 1. The configurations identical to those of embodiment 1 are given identical reference numerals and descriptions thereof are omitted.

As shown in FIGS. 8 to 12, the spacer 60 is composed of an insulating composite resin and is arranged between the circuit board 23 and the screw 75. The spacer 60 includes a tubular insertion portion 61 through which a shaft portion 77 of the screw 75 is insertred, a board presser 64 pressing the circuit board 23 when the circuit board 23 is screwed to the heat release member 67, and a heat release member presser 65 pressing the heat release member 67 when the circuit board 23 is screwed to the heat release member 67.

The insertion portion 61 is formed with an insertion hole 62 where the shaft portion 77 of the screw 75 is inserted and includes a receiver 63 receiving a head 76 of the screw 75. The insertion hole 62 includes a head insertion hole 62A where the head 76 of the screw 75 is inserted and a shaft portion insertion hole 62B, which has a diameter reduced in a stepped shape from the head insertion hole 62A, and through which the shaft portion 77 is inserted.

The head insertion hole 62A is formed in a true circular shape having substantially the same diameter as the head 76 and most of the head 76 is fitted in the head insertion hole 62A, except for a top portion of the head 76. The shaft insertion hole 62B has a diameter reduced in a stepped shape from the head insertion hole 62A and is formed having a slight gap between the shaft portion 77 and the shaft insertion hole 62B. The receiver 63 is formed on the bottom of the spacer 60 and a step portion 63A forming unevenness between the head insertion hole 62A and the shaft insertion hole 62B is a top surface receiving the head 76.

The board presser 64 is integrally formed with the insertion portion 61 and is a portion projecting outward from the insertion portion 61. The board presser 64 has a large projecting dimension on the lower end side and therefore an outer circumference of the spacer 60 is formed in a tapered shape having the diameter on the lower side increasing. The bottom face 64A of the board presser 64 is flat and formed in the true circle annular shape centered on the center axis X of the spacer 60, and is overlaid on the circuit board 23 along the circumference edge of the through hole 27 of the circuit board 23.

The heat release member 67 is integrally formed with the insertion portion 61, is formed in the true circle annular shape below and further inward than the board presser 64, and presses the adhesive layer 32 so as to include the edge 32A of the adhesive layer 32 from above. By pressing the edge 32A of the adhesive layer 32 with the heat release member presser 65, the creepage distance is secured between the heat release board (heat release member 67) and the circuit structure (circuit board 23). The adhesive stands in a depression 68 preventing the adhesive from entering a screw hole 69. The projection dimension of the heat release member presser 65 from the bottom face 64A of the board presser 64 is the same as the thickness dimension of the circuit board 23. The gap is formed between the outer circumference of the heat release member presser 65 and the wall of the insertion hole 62 of the circuit board 23.

In the heat release member 67, the depression 68 is formed, the depression 68 sinking lower than a top surface 67A of the heat release member 67 pressed by the heat release member presser 65. The receiver 63 receiving the head 76 of the screw 75 is formed around the insertion hole 62 of the spacer 60, and the receiver 63 enters inside the depression 68.

A manufacturing method of the circuit structure 20 is described. The circuit board 23 is formed by bonding the insulating board 24 and the bus bar 25 with the adhesive. By reflow soldering the electronic components 21A to 21D, the electronic components 21A to 21D and the like are mounted to the circuit board 23.

The adhesive layer 32 is formed by applying the adhesive at the predetermined position on the top surface 67A of the heat release member 67, and the circuit board 23 is overlaid on the adhesive layer 32. Then, the spacer 60 is attached by inserting the heat release member presser 65 of the spacer 60 through the through hole 27 of the circuit board 23. At this time, the bottom face 64A of the board presser 64 of the spacer 60 makes contact with the top surface of the circuit board 23 and the bottom face of the heat release member presser 65 is arranged on top of the edge 32A of the adhesive layer 32.

The shaft portion 77 of the screw 75 is inserted through the insertion hole 62 of the spacer 60 and the screw 75 is threadably mounted to the screw hole 30 of the heat release member 67. When the bottom face of the head 76 contacts the receiver 63 by threadably mounting the screw 75 to the screw hole 30, and the screw 75 is further screwed, the bottom face 64A of the board presser 64 presses downward the entire circumference of the edge of the through hole 27 of the circuit board 23 and the bottom face of the heat release member presser 65 presses downward the circular edge 32A of the adhesive layer 32. According to the embodiment 2, the receiver 63 receiving the head 76 of the screw 75 enters the depression 68 and allows the position of the head 76 of the screw 75 to be lower.

Embodiment 3

Figure 13:
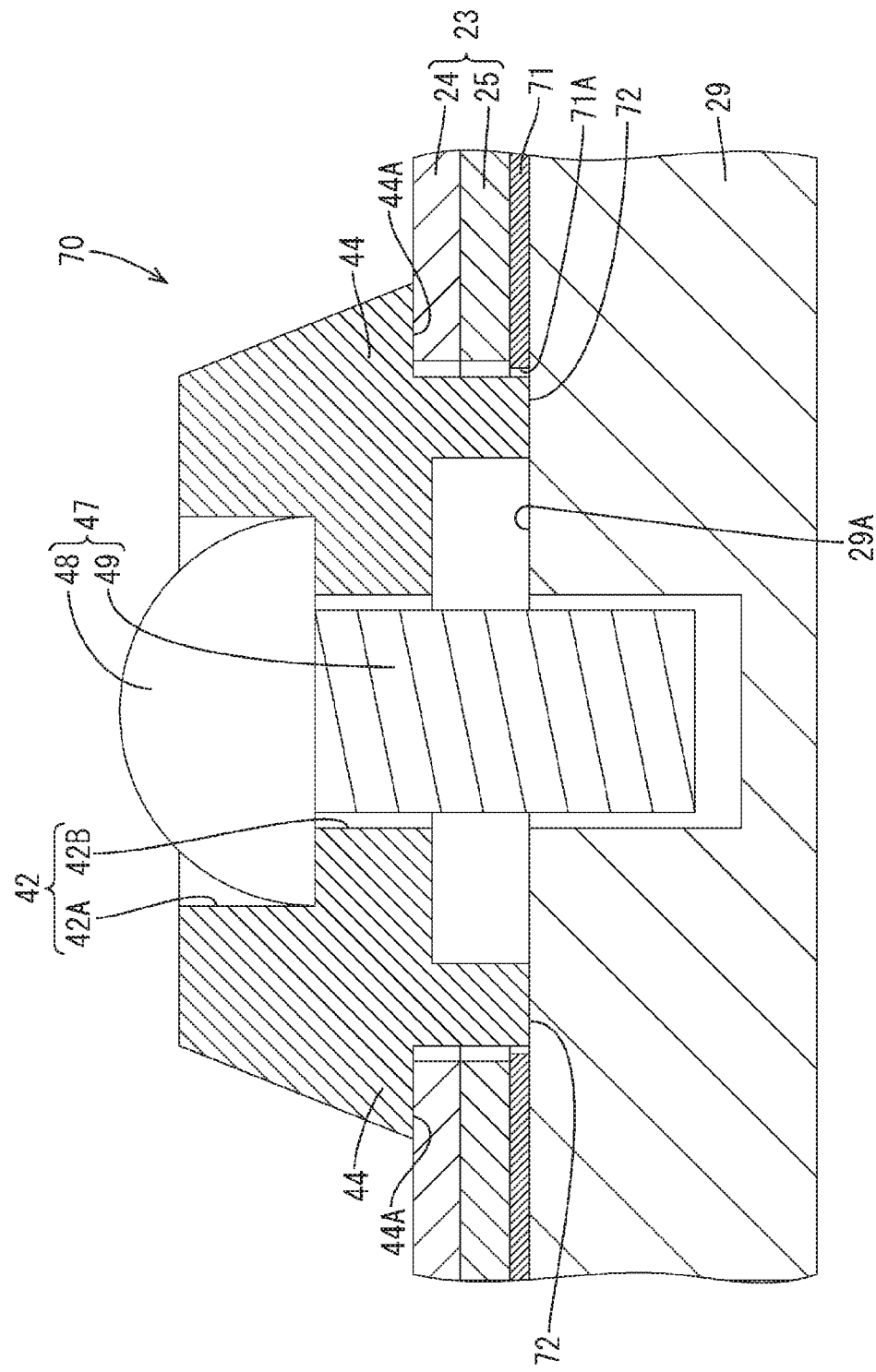
FIG. 13 is a cross-sectional, expanded view of a portion of a circuit structure screwed down using a screw according to an embodiment 3.

As shown in FIG. 13, in a spacer 70 according to an embodiment 3, a heat release member presser 72 directly (not indirectly via the adhesive layer) presses the top surface 29A of the heat release member 29. The configurations identical to those embodiments mentioned above are given identical reference numerals and descriptions thereof are omitted. An adhesive layer 71 with an edge 71A forming an opening with an area larger than the opening provided by the edge 32A of the adhesive layer 32 in the embodiment 1 is overlaid on the top surface 29A of the heat release member 29. Accordingly, the adhesive layer 71 is arranged outside the annular heat release member presser 72 and is not arranged inside or below the heat release member presser 45.

The projection dimension from the bottom face 44A of the board presser 44 of the heat release member presser 72 (dimension in the up-down direction in FIG. 13) is the same dimension as a thickness dimension of the adhesive layer 71 added to the thickness dimension of the circuit board 23 (dimension in the up-down direction in FIG. 13). In this way, the heat release member presser 72 is tightly attached to the heat release member 29 and therefore, the heat release member presser 72 can suppress the adhesive of the adhesive layer 71 from being transmitted toward the screw 47.

Embodiment 4

Figure 14:
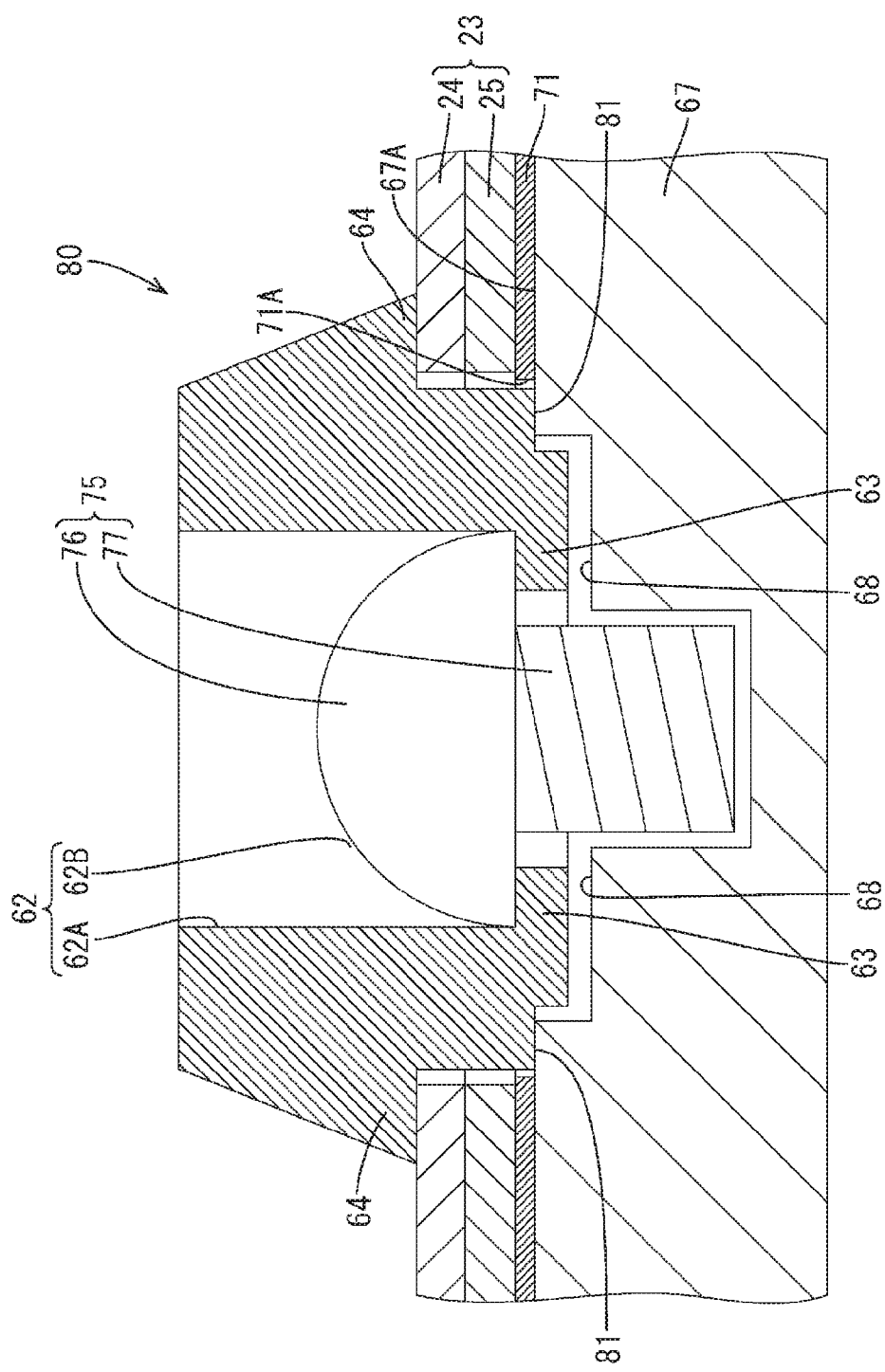
FIG. 14 is a cross-sectional, expanded view of a portion of a circuit structure screwed down using a screw according to an embodiment 4.

As shown in FIG. 14, in a spacer 80 according to an embodiment 4, a heat release member presser 81 directly presses the top surface of the heat release member 67. The configurations identical to those embodiments mentioned above are given identical reference numerals and descriptions thereof are omitted. The adhesive layer 71 is arranged outside the annular heat release member presser 81 and is not arranged inside or below the heat release member presser 45. The projection dimension of the heat release member presser 81 (dimension in the up-down direction in FIG. 14) is the same dimension as the thickness dimension of the adhesive layer 71 added to the thickness dimension of the circuit board 23 (dimension in the up-down direction in FIG. 14).

Other Embodiments

The present invention is not limited to the embodiments according to the above description and the drawings; instead, the technical scope of the present invention also includes the following embodiments, for example. (1) The above embodiments are configured such that the screw 47 or 75 is screwed to the heat release member 29, however, the embodiments are not limited to this. For example, a bolt (as the male screw) may stand up from the heat release member 29, and a nut (as the female screw) may be threadably mounted from above the spacer 40, 60, 70, or 80, such that the receiver 43 or 63 of the spacer may receive the nut.

(2) The adhesive layer is not limited to the adhesive. For example, a sticking agent, or a thermal conductive sheet having adhesive or tacky characteristics can be used. As the thermal conductive sheet, for example, a thermal conductive sheet can be used in which an adhesive having insulating characteristics is applied to both sides of a film made of synthetic resin having insulating characteristics. In addition, an adhesive tape or a tacky tape may be used as the adhesive layer, for example.

DESCRIPTION OF REFERENCE NUMERALS

10: Electrical junction box
20: Circuit structure 21A to 21D: Electronic component
23: Circuit board
29, 67: Heat release member
30, 69: Screw hole
32, 71: Adhesive layer
40, 60, 70, 80: Spacer
41: Insertion portion
42: Insertion hole
43, 63: Receiver
44, 64: Board presser
45, 65, 72, 81: Heat release member presser
47, 75: Screw

The invention claimed is:

1. A circuit structure comprising:
a circuit board mounted with electronic components,
a heat release member overlaid by the circuit board and configured to release heat of the circuit board,
a screw screwing the circuit board to the heat release member, and
a spacer having a main body through which an insertion hole is formed into which a shaft portion of the screw is inserted, the spacer being arranged between the circuit board and the screw to receive the screw,
wherein, when the circuit board is screwed to the heat release member using the screw, the spacer comprises a board presser extending radially from the main body with respect to a central axis of the insertion hole and pressing the circuit board, and a heat release member presser extending from the board presser in the direction of the central axis of the insertion hole and pressing the heat release member.

2. The circuit structure according to claim 1, wherein the spacer has insulating characteristics,
an adhesive layer having insulating characteristics is overlaid on a surface on the circuit board side of the heat release member, and
the heat release member presser presses the heat release member from above the adhesive layer.

3. The circuit structure according to claim 2, wherein the heat release member presser presses an edge of the adhesive layer.

4. The circuit structure according to claim 1, wherein the heat release member presser is in close contact with the heat release member.

5. The circuit structure according to claim 1, wherein the heat release member presser is arranged annularly around the shaft portion of the screw.

6. An electrical junction box comprising the circuit structure according to claim 1.

7. The circuit structure according to claim 1, further comprising the board presser extending radially beyond the heat release member presser so as to define an annular recess at a lower outer circumference of the spacer.

8. A circuit structure comprising:
a circuit board mounted with electronic components,
a heat release member overlaid by the circuit board and configured to release heat of the circuit board,
a screw screwing the circuit board to the heat release member, and
a spacer on which an insertion hole is formed into which a shaft portion of the screw is inserted, the spacer being arranged between the circuit board and the screw to receive the screw,
wherein, when the circuit board is screwed to the heat release member using the screw, the spacer comprises a board presser pressing the circuit board, and a heat release member presser pressing the heat release member,
wherein a depression is formed in the heat release member, the depression extending lower than a surface of the heat release member where the heat release member presser presses, and
a receiver receiving the screw is formed around the insertion hole on the spacer and the receiver enters the depression.

9. A spacer having a main body through which an insertion hole is formed into which a shaft portion of a screw is inserted, the spacer configured to be arranged between a circuit board and the screw to receive the screw,
wherein, when the circuit board is screwed to a heat release member configured to release heat of the circuit board using the screw, the spacer comprises a board presser extending radially from the main body with respect to a central axis of the insertion hole and configured to press the circuit board and a heat release member presser extending from the board presser in the direction of the central axis of the insertion hole and configured to press the heat release member.

10. The spacer according to claim 9, further comprising the board presser extending radially beyond the heat release member presser so as to define an annular recess at a lower outer circumference of the spacer.

* * * * *